United States Patent
Hong

(10) Patent No.: US 7,723,795 B2
(45) Date of Patent: May 25, 2010

(54) SEMICONDUCTOR MEMORY DEVICE

(75) Inventor: Ji-Ho Hong, Hwaseong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/234,724

(22) Filed: Sep. 22, 2008

(65) Prior Publication Data

US 2009/0085118 A1  Apr. 2, 2009

(30) Foreign Application Priority Data

Sep. 27, 2007  (KR) .............. 10-2007-0097297

(51) Int. Cl.
*H01L 27/088* (2006.01)
(52) U.S. Cl. .............. 257/365; 257/369; 257/393; 257/401; 257/903; 257/E29.022
(58) Field of Classification Search .......... 257/365, 257/369, 393, 903, 401, E29.022
See application file for complete search history.

(56) References Cited

U.S. PATENT DOCUMENTS 6,437,455 B2 * 8/2002 Mori et al. ............ 257/369

2006/0163613 A1 * 7/2006 Chang et al. .......... 257/202

* cited by examiner

*Primary Examiner*—Tan N Tran
(74) *Attorney, Agent, or Firm*—Sherr & Vaughn, PLLC

(57) ABSTRACT

A semiconductor memory device includes a first active region formed having a first portion extending laterally and second portion extendedly vertically upward from a central portion of the first portion; a second active region formed spaced from the first active region, the second active region having a third portion extending laterally, fourth and fifth portions extending vertically downwardly at distal end portions of the third portion, and a sixth portion extending vertically downwardly at a central portion of the third portion; a first gate formed extending vertically and overlapping the first portion of the first active region and the third portion of the second active regions; a second gate formed extending vertically and overlapping the first portion of the first active region and the third portion of the second active regions; a third gate formed extending in a direction perpendicular to the first and second gates and overlapping of the fourth and fifth portions of the second active region; and a plurality of contacts spaced apart predetermined distances from the gates.

20 Claims, 4 Drawing Sheets

SEMICONDUCTOR MEMORY DEVICE

Figure 1:
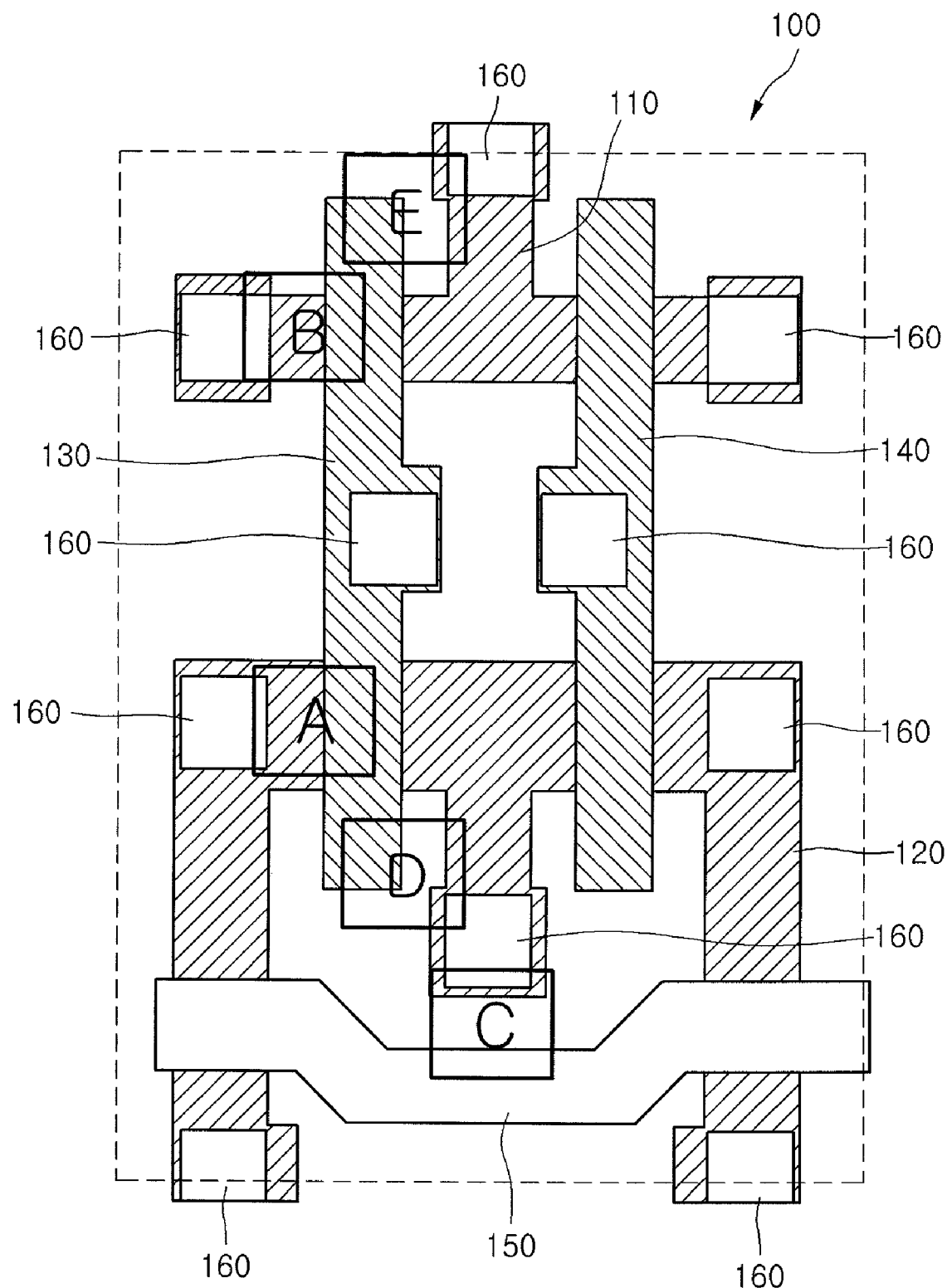

The present application claims priority under 35 U.S.C. §119 to Korean Patent Application No. 10-2007-0097297 (filed on Sep. 27, 2007), which is hereby incorporated by reference in its entirety.

BACKGROUND

A cell array scheme of a semiconductor memory device is an important technology determining a specification of the device, together with a structure of a semiconductor layer and a process condition. The semiconductor memory device of such a cell array scheme has a stack-type gate structure, and shares a line contact with electrode lines in a plurality of cells, thereby making it possible to realize high integration. Also, since it is possible to connect in parallel and layer the electrode lines and the contact, it may implement a high function of the device.

However, the semiconductor memory device of the cell array scheme has a problem that wiring density becomes high, and it is difficult to secure an accurate process margin so that yield is deteriorated. Particularly, in a case where a sufficient process margin is not secured in a distance between the contact and a gate line, the yield may be largely deteriorated. However, in this aspect, a study on the process margin is not sufficient, for example, a probe test cannot be performed.

SUMMARY

Embodiments relate to a semiconductor memory device having high integration and a high function by securing an accurate process margin between a contact and a gate line, in a cell array structure.

Embodiments relate to a semiconductor memory device that may include at least one of the following: a first active region formed having a first portion extending laterally and second portion extendedly vertically upward from a central portion of the first portion; a second active region formed spaced from the first active region, the second active region having a third portion extending laterally, fourth and fifth portions extending vertically downwardly at distal end portions of the third portion, and a sixth portion extending vertically downwardly at a central portion of the third portion; a first gate formed extending vertically and overlapping the first portion of the first active region and the third portion of the second active regions; a second gate formed extending vertically and overlapping the first portion of the first active region and the third portion of the second active regions; a third gate formed extending in a direction perpendicular to the first and second gates and overlapping of the fourth and fifth portions of the second active region; and a plurality of contacts formed at distal ends of the first portion of the first active region, at a distal end of the second portion of the first active region, at distal ends of the second active region where the fourth and fifth portions intersect the third portion, at a distal end of the sixth portion of the second active region, and in portions of the first gate and the second gate in the space between the first active region and the second active region.

Embodiments relate to an apparatus that may include at least one of the following: a first active region formed having a first portion extending laterally and second portion extendedly vertically upward from a central area of the first portion; a second active region formed spaced from the first active region, the second active region having a third portion extending laterally, fourth and fifth portions extending vertically downwardly at distal end portions of the third portion, and a sixth portion extending vertically downwardly at a central portion of the third portion; a first gate having a first gate portion overlapping the first portion of the first active region and a second gate portion overlapping the third portion of the second active region, wherein a distal end of the first gate portion is bent outwardly in a direction away from the second portion of the first active region and a distal end of the second gate portion is bent outwardly in a direction away from the sixth portion of the second active region; a second gate having a third gate portion overlapping the first portion of the first active region and a fourth gate portion overlapping the third portion of the second active region, wherein a distal end of the third gate portion is bent outwardly in a direction away from the second portion of the first active region and a distal end of the fourth gate portion is bent outwardly in a direction away from the sixth portion of the second active region; a third gate overlapping of the fourth and fifth portions of the second active region; and a plurality of contacts formed at distal ends of the first portion of the first active region, at a distal end of the second portion of the first active region, at distal ends of the second active region where the fourth and fifth portions intersect the third portion, at a distal end of the sixth portion of the second active region, and in portions of the first gate and the second gate in the space between the first active region and the second active region.

DRAWINGS

Figure 2:
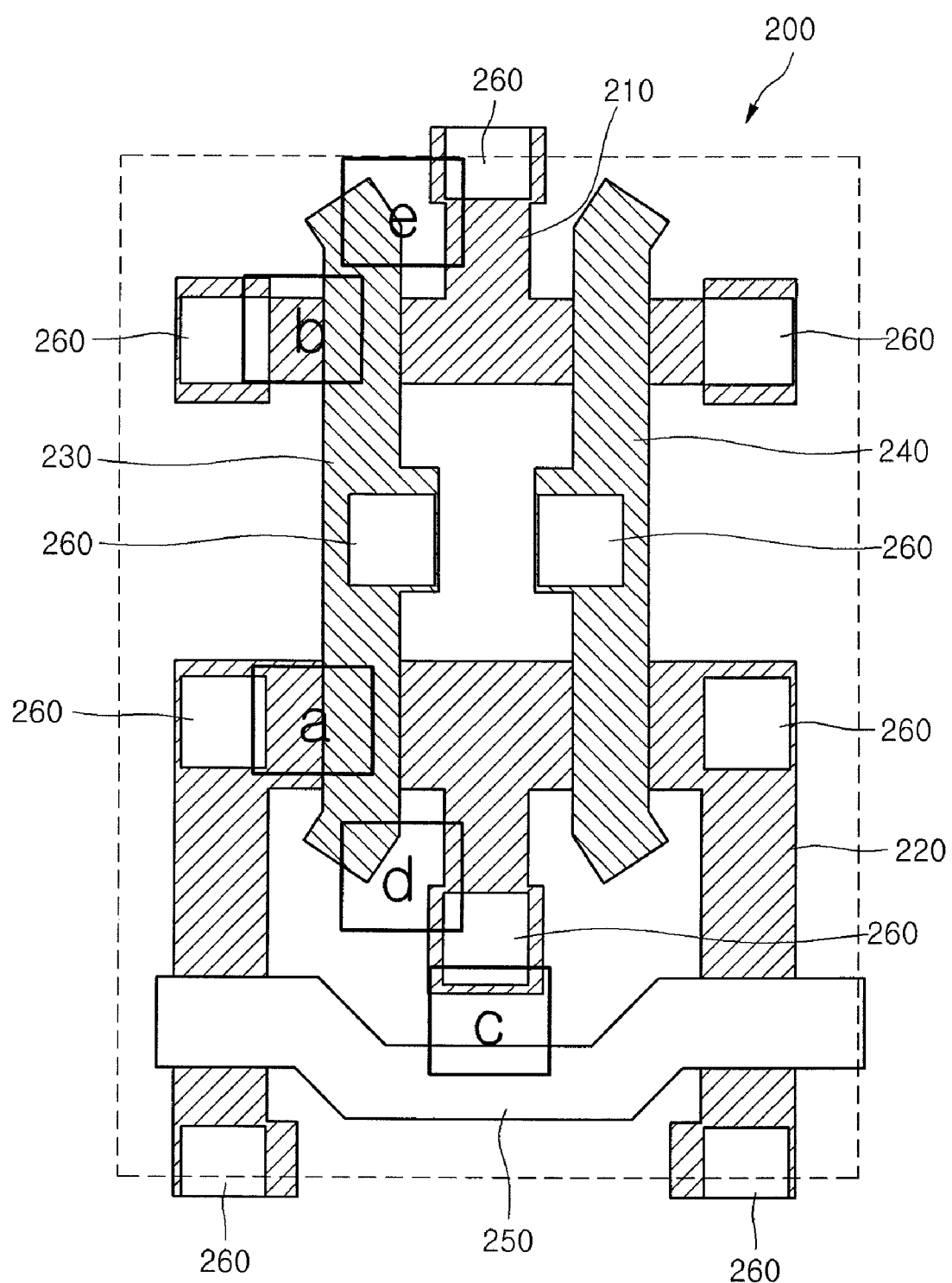
Figure 3:
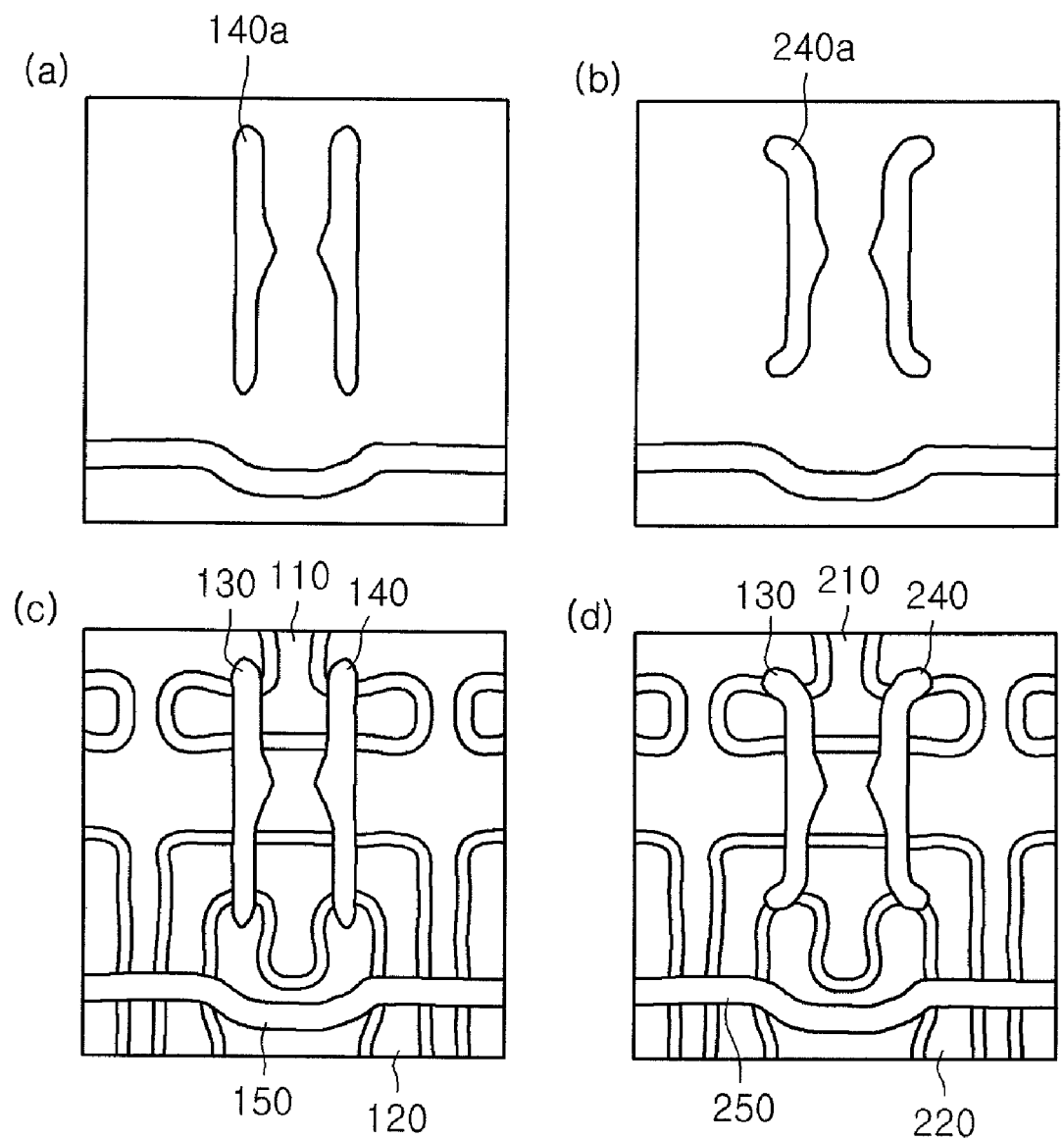

Example FIGS. 1 to 3 illustrate an electrode structure of a semiconductor memory device and semiconductor memory devices in accordance with embodiments.

Figure 4:
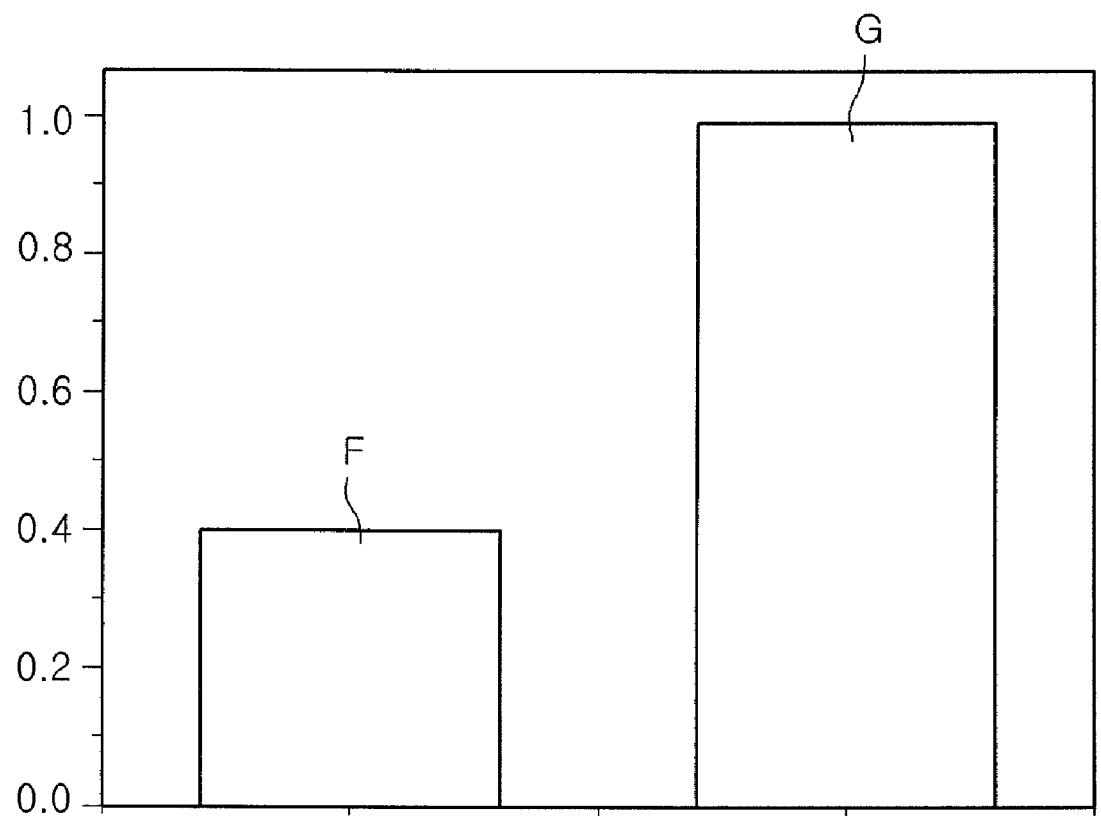

FIG. 4 illustrates a graph comparing probe yields of semiconductor memory devices in accordance with embodiments.

DESCRIPTION

A semiconductor memory device in accordance with embodiments will be described in detail with reference to accompanying drawings. Herein, a semiconductor memory device having a cell array structure and fabricated by a 90 nm logic process of a 4 mega 6-T SRAM is explained by way of example.

As illustrated in example FIG. 1, which illustrates a one bit cell, semiconductor memory device 100 may include a plurality of active regions 110 and 120, a plurality of gates 130, 140, and 150, and a plurality of contacts 160. Hereinafter, for convenience of explanation, an upper-portion of active region of device 100 will be referred to as first active region 110, a lower-portion of active region of device 100 will be referred to as second active region 120, a gate line formed laterally on the left portion of device 100 will be referred to as first gate 130, a gate line formed laterally on the right portion of device 100 will be referred to as second gate 140, and a gate line formed laterally on a lower portion of device 100 will be referred to as third gate 150.

Active regions 110 and 120 may be diffused into an N+ diffusion region and include a channel region, a source region, and a drain region. First active region 110 and second active region 120 include lateral or horizontal portion extending parallel to each other. First active region 110 has an inverted "T" shaped form including the lateral portion and a vertical portion extending upwardly at a center portion of the horizontal portion. Second active region 120 has an "M" shaped form that includes the horizontal portion, first and second vertical portions extending downwardly at distal end portions of the horizontal portion and a third vertical portion extending downwardly at a center portion of the horizontal portion.

Contacts 160 are formed in first active region 110 at both distal ends of the horizontal portion and also at a distal end of the upwardly extending vertical portion of the first active region 110. Contacts 160 are also formed in second active region 120 at distal ends of the bent portion where the downwardly extending first and second vertical portions intersect the lateral portion and also at a distal end of the downwardly extending third vertical portion of the second active region 120. First gate 130 and second gate 140 extend vertically with respect to the device 100 in parallel to each other and are formed to overlap the lateral portions first active region 110 and second active region 120. Contacts 160 are formed in center portions of first gate 130 and second gate 130 between first active region 110 and second active region 120. Third gate 150 extends laterally or horizontally and formed to overlap the first and second vertical portions of second active region 120 but under the third vertical portion of second active region 120. A separation region is formed between first active region 110, second active region 120 and gates 130, 140, and 150 as a shallow trench isolation (STI) region.

In semiconductor memory device 100 in accordance with embodiments, a margin between contacts 160 of active regions 110 and 120 and gates 130, 140, and 150 may be considered as a factor having an effect on yield. Particularly, portions denoted by a rectangle illustrated in example FIG. 1 among a spacing region between contacts 160 of active regions 110 and 120 and gates 130, 140, and 150 are portions having an important impact on the yield. By way of reference, portions A, B, C, D, and E denoted by the rectangle will be referred to as "first spacing region A," "second spacing region B," "third spacing region C," "fourth spacing region D," and "fifth spacing region E." Embodiments have been designed so that spacing regions A, B, C, D, and E have a sufficient process margin.

First gate 130 and second gate line 140 are formed so that a remaining portion is thin except for the center portion in which contact 160 is formed or a portion adjacent to contacts 160 of first active region 110 and second active region 120. Therefore, first spacing region A and second spacing region B may be adjusted to a range of about approximately 74 nm to 78 nm. A center portion of third gate 150 is bent such that third gate 150 is has a "U" shape. Therefore, third spacing region C may be adjusted to a range of about approximately 76 nm to 80 nm. The thickness of third gate 150 may also be adjusted. First gate line 130 and second gate line 140 are formed in a straight line extending vertically and their widths and lengths are adjusted so that fourth spacing region D and fifth spacing region E may be adjusted to a range of about approximately 74 nm to 78 nm. The thicknesses of the centrally extending vertical portions of first active region 110 and second active region 120 may be adjusted. When first spacing region A, second spacing region B, fourth spacing region D and fifth spacing region E are formed to about approximately 76 nm, third spacing region C may be formed to about approximately 78 nm, and when an overall size of semiconductor memory device 100 is reduced, a ratio between the spacing regions may be equally applied.

As illustrated in example FIG. 2, which illustrates showing a one bit cell, semiconductor memory device 200 in accordance with embodiments may include a plurality of active regions 210 and 220, a plurality of gates 230, 240, and 250, and a plurality of contacts 260. Since a structure and a form of semiconductor memory device 200 illustrated in example FIG. 2 are similar to those of semiconductor memory device 100 illustrated in example FIG. 1, repeated explanation will be omitted. Semiconductor memory device 200 may include first active region 210, second active region 220, first gate 130, second gate 140, and third gate 250. Hereinafter, differences between semiconductor memory device 200 illustrated in example FIG. 2 and semiconductor memory device 100 illustrated in example FIG. 1 are described.

Distal end portions of first gate 230 and second gate line 240 are bent outwardly relative to the center vertical portions of first active region 210 and second active region 220. It is preferable that distal ends of first gate line 230 and second gate line 240 are bent at about 45° relative to the vertically extending base portions of gates 230 and 240. Therefore, fourth spacing region d and fifth spacing region e may be formed larger than those illustrated in example FIG. 1. Accordingly, each position of first gate 230 and second gate line 240 may be adjusted to a center point. Also, fourth spacing region d and fifth spacing region e are formed larger than those illustrated in example FIG. 1, so that a length of the center vertical portion of second active region 220 may become shorter than that illustrated in example FIG. 1 and a space from third gate line 250, i.e., a width of third spacing region c may become wider than that illustrated in example FIG. 1. With such a structure, first spacing region a, second spacing region b, fourth spacing region d and fifth spacing region e may be formed in a range of about approximately 80 nm to 84 nm, and third spacing region e may have a space in a range of about approximately 82 nm to 86 nm. When first spacing region a, second spacing region b, fourth spacing region d and fifth spacing region e are formed at about 82 nm, third spacing region c may be formed at 84 nm, and when an overall size of semiconductor memory device 200 is reduced, a ratio between the spacing regions may be equally applied.

The bit cell of semiconductor devices 100 and 200 in accordance with embodiments may be fabricated in a size having a length of 1.528 μm and a width of 2 μm.

Example FIGS. 3(a) to 3(d) illustrate depictions of semiconductor memory device 100 illustrated in example FIG. 1 and semiconductor memory device 200 illustrated in example FIG. 2. The photographs were done by a scanning electronic microscope (SEM), and example FIGS. 3(a) and 3(b) are depictions illustrating patterns 140a and 240a after a photolithography process for forming first gate 130 and second gate 140 illustrated in example FIG. 1 and first gate 230 and second gate 240 illustrated in example FIG. 2, respectively. Example FIGS. 3(c) and 3(d) illustrate a form first gate 130 and second gate 140 illustrated in example FIG. 1 and first gate 230 and second gate 240 illustrated in example FIG. 2 are etched after forming patterns 140a and 240a, respectively.

Comparing semiconductor memory device 100 illustrated in example FIG. 1 and semiconductor memory device 200 illustrated in example FIG. 2, spacing regions a and b secured in semiconductor memory device 200 illustrated in example FIG. 2 may be formed wider on the order of about 6 nm than those of semiconductor memory device 100 illustrated in example FIG. 1.

After formation of gates 130, 140, 150, 230, 240, and 250, active regions 110, 120, 210, and 220, and contacts 160, 260, an electrical characteristic and an operation state of a wafer were tested using a probe to classify superior goods and inferior goods and thereby determine whether or not repairs are required.

As illustrated in example FIG. 4, both probe yields of semiconductor memory device 100 illustrated in example FIG. 1 and semiconductor memory device 200 illustrated in example FIG. 2 were measured to be higher than those semiconductor memory devices made using other techniques. It may be appreciated that semiconductor memory device 100 illustrated in example FIG. 1, indicated as (F) shows about 40% (Y-axis) of semiconductor memory device 200 illustrated in example FIG. 2, indicated as (G), on the basis of the yield of semiconductor memory device 200 illustrated in example FIG. 2.

In accordance with embodiments, an accurate process margin between contacts and gates is secured, thereby making it possible to highly integrate the cell array structure of the semiconductor memory device. Secondly, it is possible to maximize the yield of the semiconductor memory device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
a first active region formed having a first portion extending laterally and second portion extendedly vertically upward from a central area of the first portion;
a second active region formed spaced from the first active region, the second active region having a third portion extending laterally, fourth and fifth portions extending vertically downwardly at distal end portions of the third portion, and a sixth portion extending vertically downwardly at a central portion of the third portion;
a first gate formed extending vertically and overlapping the first portion of the first active region and the third portion of the second active region;
a second gate formed extending vertically and overlapping the first portion of the first active region and the third portion of the second active region;
a third gate formed extending in a direction perpendicular to the first and second gates and overlapping of the fourth and fifth portions of the second active region; and
a plurality of contacts formed at distal ends of the first portion of the first active region, at a distal end of the second portion of the first active region, at distal ends of the second active region where the fourth and fifth portions intersect the third portion, at a distal end of the sixth portion of the second active region, and in portions of the first gate and the second gate in the space between the first active region and the second active region.

2. The semiconductor memory device of claim 1, wherein the first gate and the second gate lines extend parallel to each other.

3. The semiconductor memory device of claim 1, wherein the first gate overlaps the second active region between the fourth portion and the sixth portion of the second active region.

4. The semiconductor memory device of claim 3, wherein the second gate overlaps the second active region between the fifth portion and the sixth portion of the second active region.

5. The semiconductor memory device of claim 1, wherein a central portion of the third gate is bent downwardly at a portion adjacent to the sixth portion of the second active region.

6. The semiconductor memory device of claim 1, wherein distal end portions of the first gate are bent outwardly.

7. The semiconductor memory device of claim 6, wherein distal end portions of the second gate are bent outwardly.

8. The semiconductor memory device of claim 7, wherein a spatial distance between one of the contacts formed at distal ends of the first portion of the first active region and the first gate is in a range between approximately 80 nm to 84 nm.

9. The semiconductor memory device of claim 8, wherein a spatial distance between one of the contacts formed at distal ends of the first portion of the first active region and the second gate is in a range between approximately 80 nm to 84 nm.

10. The semiconductor memory device of claim 9, wherein a spatial distance between one of the contacts formed at the distal end of the sixth portion of the second active region and the third gate is in a range between approximately 82 nm to 86 nm.

11. The semiconductor memory device of claim 1, wherein a distal end portion of the first gate overlapping the second active region is formed between the fourth portion and the sixth portion of the second active region and bent outwardly away from the sixth portion of the second active region.

12. The semiconductor memory device of claim 11, wherein a distal end portion of the second gate overlapping the second active region is formed between the fifth portion and the sixth portion of the second active region and bent outwardly away from the sixth portion of the second active region.

13. The semiconductor memory device of claim 1, wherein a distal end portion of the first gate overlapping the second active region is positioned within an area enclosed by the second active region and the third gate line.

14. The semiconductor memory device of claim 13, wherein a distal end portion of the second gate overlapping the second active region is positioned within an area enclosed by the second active region and the third gate line.

15. The semiconductor memory device of claim 1, wherein a spatial distance between one of the contacts formed at distal ends of the second active region where the fourth portion intersects the third portion and the first gate is in a range between approximately 74 nm to 78 nm.

16. The semiconductor memory device of claim 15, wherein a spatial distance between one of the contacts formed at distal ends of the second active region where the fifth portion intersects the third portion and the second gate is in a range between approximately 74 nm to 78 nm.

17. The semiconductor memory device of claim 16, wherein a spatial distance between one of the contacts formed at the distal end of the sixth portion of the second active region and the third gate is in a range between approximately 76 nm to 80 nm.

18. An apparatus comprising:
a first active region formed having a first portion extending laterally and second portion extendedly vertically upward from a central area of the first portion;
a second active region formed spaced from the first active region, the second active region having a third portion extending laterally, fourth and fifth portions extending vertically downwardly at distal end portions of the third portion, and a sixth portion extending vertically downwardly at a central portion of the third portion;
a first gate having a first gate portion overlapping the first portion of the first active region and a second gate portion overlapping the third portion of the second active region, wherein a distal end of the first gate portion is bent outwardly in a direction away from the second portion of the first active region and a distal end of the second gate portion is bent outwardly in a direction away from the sixth portion of the second active region;
a second gate having a third gate portion overlapping the first portion of the first active region and a fourth gate portion overlapping the third portion of the second active region, wherein a distal end of the third gate portion is bent outwardly in a direction away from the second portion of the first active region and a distal end of the fourth gate portion is bent outwardly in a direction away from the sixth portion of the second active region;

a third gate overlapping of the fourth and fifth portions of the second active region; and a plurality of contacts formed at distal ends of the first portion of the first active region, at a distal end of the second portion of the first active region, at distal ends of the second active region where the fourth and fifth portions intersect the third portion, at a distal end of the sixth portion of the second active region, and in portions of the first gate and the second gate in the space between the first active region and the second active region.

19. The apparatus of claim 18, wherein a spatial distance between one of the contacts formed at distal ends of the first portion of the first active region and the first gate is in a range between approximately 80 nm to 84 nm and a spatial distance between one of the contacts formed at distal ends of the first portion of the first active region and the second gate is in a range between approximately 80 nm to 84 nm.

20. The apparatus of claim 19, wherein a spatial distance between one of the contacts formed at the distal end of the sixth portion of the second active region and the third gate is in a range between approximately 82 nm to 86 nm.

* * * * *